United States Patent
Doyle et al.

(10) Patent No.: US 6,388,328 B1
(45) Date of Patent: May 14, 2002

(54) CAPPING LAYER IN INTERCONNECT SYSTEM AND METHOD FOR BONDING THE CAPPING LAYER ONTO THE INTERCONNECT SYSTEM

(75) Inventors: Brian Doyle, Cupertino; Quat T. Vu, Santa Clara, both of CA (US); Leopold Yau, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/143,295

(22) Filed: Aug. 28, 1998

Related U.S. Application Data

(63) Continuation of application No. 08/671,968, filed on Jun. 28, 1996, now Pat. No. 5,863,832.

(51) Int. Cl.[7] .......................... H01L 23/48; H01L 23/52
(52) U.S. Cl. .................. 257/758; 257/753; 257/767
(58) Field of Search .............................. 257/758, 763, 257/767, 773, 751, 503, 522, 752, 753; 438/619, 623, 926

(56) References Cited

U.S. PATENT DOCUMENTS

| | | | |
|---|---|---|---|
| 5,112,761 A | 5/1992 | Matthews | 438/207 |
| 5,257,162 A | 10/1993 | Crafts | 361/704 |
| 5,289,035 A | 2/1994 | Bost et al. | 257/750 |
| 5,289,337 A | 2/1994 | Aghazadeh et al. | 361/718 |
| 5,414,221 A | 5/1995 | Gardner | 174/261 |
| 5,431,863 A | 7/1995 | Mochizuki et al. | 264/400 |
| 5,476,817 A | 12/1995 | Numata | 438/619 |
| 5,624,868 A | 4/1997 | Iyer | 438/762 |
| 5,665,644 A * | 9/1997 | Sandhu et al. | 438/641 |
| 5,690,749 A | 11/1997 | Lee | 134/6 |
| 5,751,056 A * | 5/1998 | Numata | 257/767 |
| 5,814,888 A * | 9/1998 | Nishioka et al. | 257/758 |

FOREIGN PATENT DOCUMENTS

JP       6-97300   * 4/1994

* cited by examiner

*Primary Examiner*—Steven Loke
*Assistant Examiner*—Hung Kim Vu
(74) *Attorney, Agent, or Firm*—Blakely, Sokoloff, Taylor & Zafman LLP

(57) ABSTRACT

The present invention provides an interconnect system. The interconnect system includes a substrate, a first dielectric layer deposited upon the substrate. The interconnect system further includes at least two electrically conductive interconnect lines formed upon the first dielectric layer. Each of the at least two interconnect lines have a top surface and side surfaces. Adjacent side surfaces of two adjacent interconnect lines define therebetween a space that has a dielectric constant substantially equal to 1. A dielectric film is bonded upon the top surface of the at least two interconnect lines. The dielectric film substantially prevents obstruction of the space by further process.

8 Claims, 5 Drawing Sheets

CAPPING LAYER IN INTERCONNECT SYSTEM AND METHOD FOR BONDING THE CAPPING LAYER ONTO THE INTERCONNECT SYSTEM

This is a continuation of application Ser. No. 08/671,968, filed Jun. 28, 1996, U.S. Pat. No. 5,863,832. I hereby claim the benefit under Title 35, United States Code, Section 120 of the U.S. application Ser. No. 08/671,968, filed Jun. 28, 1996.

BACKGROUND OF THE INVENTION

(1) Field of the Invention

The present invention relates generally to integrated electronic circuits. More specifically, the present invention relates to an interconnect system for an integrated circuit and a method of fabricating the interconnect system.

(2) Description of the Related Art

Modern integrated circuits are generally made up of millions of active and passive devices such as transistors, capacitors, and resistors disposed onto a silicon wafer. These devices are initially isolated from one another, but are later interconnected together by an interconnect system to form functional circuits. The quality of the interconnect system drastically affects the performance and reliability of the fabricated circuit.

An interconnect system typically includes metal lines, spaced apart from each other, which interconnect the various active and passive devices found in a silicon wafer onto which the interconnect system had been deposited and fabricated. Insulating dielectric layers are deposited between the metal lines for isolating the metal lines from one another. Inherent in the structure of the interconnect system is a capacitance associated with the metal lines spaced apart from each other. As the capacitance is to first order inversely proportional with the distance between the metal lines, one way to reduce the capacitance between two lines would be to increase the space between the lines. However, this option is limited by the integration capacity of the integrated circuit.

A preferable way to reduce the capacitance between two lines of the interconnect system is to reduce the dielectric constant k of the dielectric material deposited between the metal lines, as the capacitance is directly proportional to the dielectric constant of the dielectric material between the metal lines. Typically, interconnect systems use a dielectric material such as Silicon Dioxide ($SiO_2$). The dielectric constant of $SiO_2$ is approximately 4. Other dielectric materials can be used such as Silicon Oxifluoride (SiOF) with a dielectric constant of 3–3.5, or Aerogel which is a foam with vacuum or air pores with a dielectric constant which can approach the dielectric constant of air, i.e., 1. The problem with dielectric materials having lower dielectric constants is that they may not adequately support the structure of the interconnect system as these materials have a relatively high Young's modulus which makes them relatively soft, especially for materials with the dielectric constant k<2.

FIG. 1 shows a cross-sectional view of an interconnect system 100. The interconnect system 1 has a substrate 2 which typically includes active and passive electronic structures. An insulating layer 4 is deposited over substrate 2. The insulating layer 4 is made of a dielectric material which provides electrical insulation between the substrate 2 and any other electrically conductive layer deposited upon layer 4. Layer 4 could be, by way of non-limiting example, silicon dioxide ($SiO_2$) either doped or undoped, silicon nitride ($Si_3N_4$) or silicon oxinitride ($SiO_xN_y$). Following the deposition of the insulating layer 4 a metal layer is deposited thereon. Electrically conductive interconnect lines 10 are then formed by etching out selected portions of the metal layer. The electrically conductive interconnect lines 10 serve the purpose of interconnecting various electronic devices, active or passive, which reside in the substrate 2. The interconnect lines 10 are spaced apart from each other in order not to short circuit the various devices to which the interconnect lines are connected. The space between interconnect lines 10 is typically filled with a dielectric material 8 which is deposited upon interconnect lines 10 forming the pattern shown in FIG. 1. A second electrically conductive layer of interconnect lines 26 is formed over the dielectric layer 8 in a direction usually orthogonal to the direction of the interconnect lines 10. Continuing the above process, more insulating layers followed by conducting layers could be deposited to finally form the interconnect system.

The interconnect system illustrated in FIG. 1 uses $SiO_2$ for the dielectric layer 8. While this type of material can provide the mechanical support necessary to withstand the stress of the structures deposited thereupon, the resulting large capacitance between lines, due to the relatively high dielectric constant of $SiO_2$, makes this material less and less desirable in the high performance interconnect systems of the future.

FIG. 2 shows a cross sectional view of an interconnect system 200 wherein the dielectric layer 8 has been applied over interconnect lines 10 so as not to fill out completely the gaps between the interconnect lines 10 and, thus, to provide for air gaps 16 between the interconnect lines 10. However, due to the nature of the structure of the interconnect system and of the various processes for deposition of the dielectric layer 8, which include physical deposition, chemical vapor deposition, and plasma deposition, a certain amount of the dielectric is incorporated between the metal lines 10. As one can see, the dielectric material 8 is still deposited between the metal lines 10 leaving small voids 16. This is undesirable as the dielectric constant and thus the capacitance between the adjacent lines increases with the amount of dielectric material between the lines.

It is desirable to provide for an interconnect system wherein the space between the interconnect lines has a dielectric constant as low as possible and substantially uniform throughout that space.

BRIEF SUMMARY OF THE INVENTION

An interconnect system is disclosed. The interconnect system according to the present invention includes a substrate and a first dielectric layer formed upon the substrate. The interconnect system further includes at least two electrically conductive interconnect lines formed upon the first dielectric layer. The at least two electrically conductive interconnect lines have a top surface and side surfaces. Adjacent side surfaces of two adjacent interconnect lines define therebetween a space that has a dielectric constant substantially equal with 1. A dielectric film is bonded onto the top surfaces of the at least two interconnect lines. The dielectric film substantially prevents obstruction, by further process, of the space formed between the two adjacent side surfaces of the two adjacent interconnect lines.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one having ordinary skill in the art will recognize that the invention may be practiced without these specific details. In some instances, well-known circuits, structures, and techniques have not been shown in detail to avoid obscuring the present invention.

Figure 1:
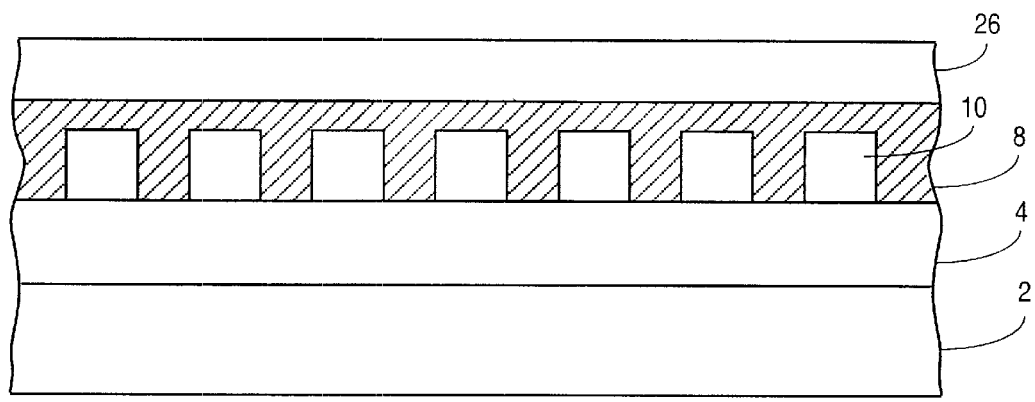
FIG. 1 illustrates a cross-sectional view of a prior art interconnect systems.
Figure 2:
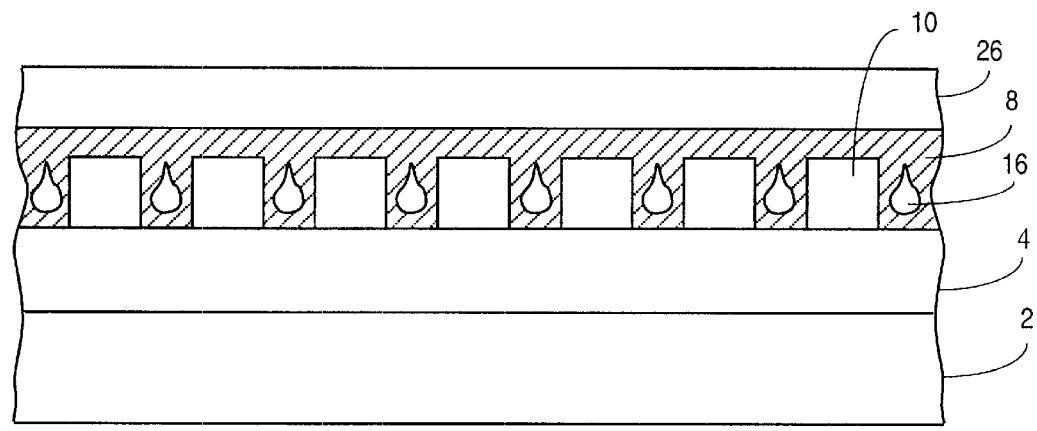
FIG. 2 illustrates a cross-sectional view of an interconnect system having air gaps interspersed therein.
Figure 3:
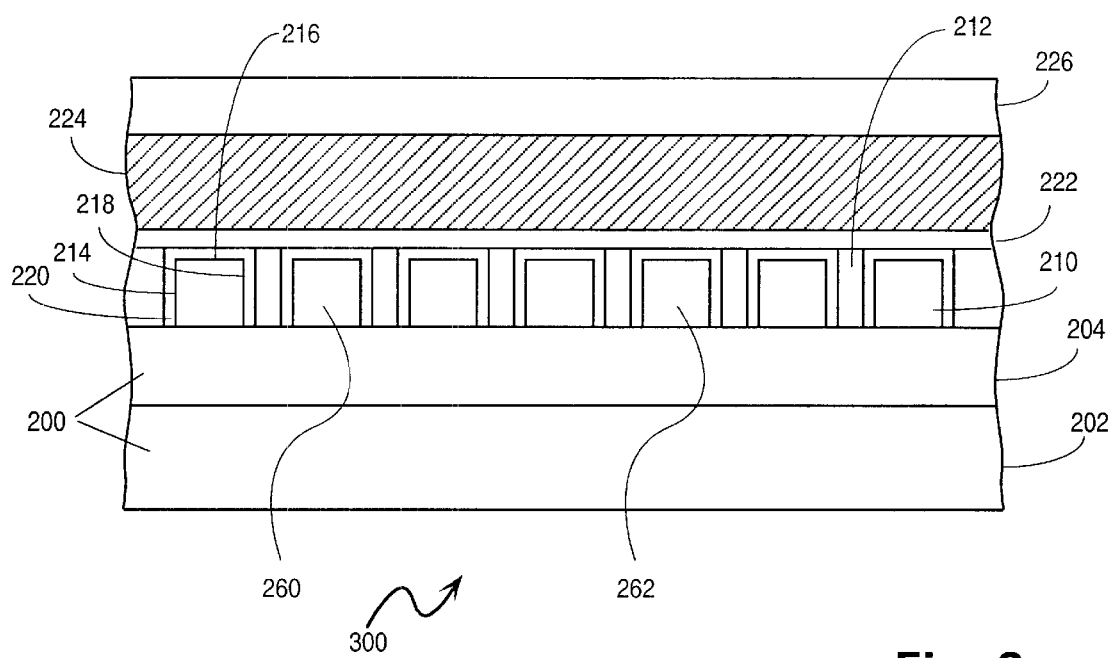
FIG. 3 illustrates a cross-sectional view of a preferred embodiment according to the present invention.

Referring now to FIG. 3, a cross-sectional view of a preferred embodiment 300 of the present invention is shown. Substrate 202 can be, by way of non-limiting example, a semiconductor wafer including device regions such as diffused junctions, other structures such as gates, local interconnects, metal layers, or other active or passive device structures or layers. In many cases, depending upon the device being fabricated, device layers or structures, or processing steps used to fabricate the device may have been omitted to avoid obscuring the present invention.

The interconnect system 200 includes a first dielectric layer 204 formed over substrate 202. Layer 204 is generally deposited over substrate 202. First dielectric layer 204 typically has a thickness equal or lower than approximately 1 $\mu$m. This layer could be, by way of non-limiting example, Silicon Dioxide ($SiO_2$), doped or undoped, Silicon Nitride ($Si_3N_4$), or Silicon Oxinitride ($SiO_xN_y$). The first dielectric layer 204 insulates between any conductive structures which are found in the substrate 202 and other conductive layers or lines which are further deposited in the interconnect system 200.

Following the deposition of the oxide layer 204, electrically conductive interconnect lines 210 are fabricated out of an electrically conductive layer formed over oxide layer 204. The electrically conductive layer 210 has a thickness in the range of 0.4 to 2.0 $\mu$m. The electrically conductive interconnect lines 210 are generally orthogonal to the plane in which the cross-section of the interconnect system 200 is shown. These interconnect lines 210 can be formed, by way of non-limiting example, by depositing a photoresist layer over the electrically conductive layer. A standard photolithography process is then performed. The photolithography process includes patterning the photoresist layer and etching the electrically conductive layer thereby producing the pattern of interconnect lines 210 shown in FIG. 3.

The interconnect lines 210 are spaced apart by spaces 212 having a width in the range of 0.3 to 2.0 $\mu$m. Spaces 212 prevent interconnect lines 210 from being short-circuited. In the embodiment, according to the present invention, the interconnect lines 210 are made of a metal such as aluminum, tungsten, or other similar conducting materials or alloys thereof. The choice of materials may depend on processing considerations. For example, if the substrate 202 is subjected to temperatures of approximately 660° C. or above, aluminum may not be used since the above-mentioned temperature is above aluminum's melting point.

The interconnect lines 210, which are spaced apart from each other, are substantially parallel to one another. Each interconnect line 210 is defined by a top surface 216 and by side surfaces 214 and 218. Adjacent side surfaces of two adjacent interconnect lines 210 define therebetween a space 212. As it is well-known, the capacitance between two interconnect lines is directly proportional to the dielectric constant of the dielectric between the two lines, and first order inversely proportional to the distance separating these lines. The spaces 212 can be filled with a very low dielectric constant material. In this particular embodiment, the dielectric material between the electrically conductive lines 210 is air. As it is well known, the dielectric constant of air is approximately 1. Therefore, the capacitance between the two adjacent interconnect lines having air in the space 212 there between is minimized.

In the preferred embodiment, each interconnect line 210 is coated with a cladding 220, preferably very thin (a few hundred Angstroms) compared to the dimensions of the interconnect line 210. The cladding 220 is deposited over each of the interconnect lines by known processes including physical vapor deposition, chemical vapor deposition, and plasma enhanced deposition. The cladding 220 can act to minimize electro-migration in the interconnect lines 210 and also acts as an adhesion layer to subsequent layers such as films, disposed onto the cladding. By way of non-limiting example, the cladding 220 can be made of $TiAl_3$. In the preferred embodiment illustrated in FIG. 3 both the side surfaces 214 and 218 and the top surface 216, of the interconnect lines 210, are coated by the cladding 220. The process of coating the interconnect lines 210 with the cladding 220 is generally well known to persons skilled in the art.

A dielectric film 222 (hereinafter "capping layer 222") is laid and bonded over the interconnect lines 210. The capping layer 222 can be made of $SiO_2$ by way of non-limiting example. The capping layer 222 helps provide an interconnect system with air spaces between interconnect lines 210. The capping layer 222 substantially prevents obstruction of the air spaces 212 by further process. These air spaces are thus substantially unencumbered by the capping layer 222 and by the various layers further deposited upon capping layer 222. The capping layer 222 has a thickness sufficient enough to withstand erosion thereof by further process. Such thickness can be, by way of non-limiting example, in the range of a few thousand Angstroms. An interconnect system with low capacitances is therefore provided by having air in spaces 212.

A second level of electrically conductive lines 226 is then formed over the capping layer 222 and the process of forming unencumbered air spaces between the second level of electrically conductive interconnect lines 226 by bonding a capping layer thereupon can be continued up to the desired level of metal lines in the interconnected system 200. A second dielectric layer 224 can be optionally interposed between the capping layer 222 and the interconnect lines 226 (before forming interconnect lines 226). The second dielectric layer 224 is deposited if it is necessary that the interlayer dielectric has a specific thickness.

Also, to better support the electrically conductive lines and the layers of dielectric further deposited upon the capping layer 222, one can insert "dummy" lines 260 and 262 between interconnect lines where the spacing between these interconnect lines is too large. The dummy lines are not coupled to the various active or passive devices residing in the substrate 202. These dummy lines merely serve the purpose of "pillars" in the interconnect system 200.

Figure 4A:
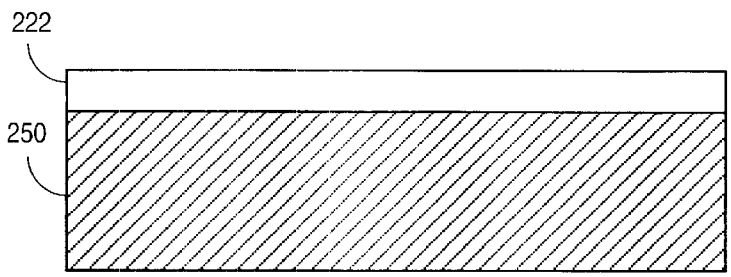
FIGS. 4a, 4b and 4c illustrate a method according to the present invention for bonding a capping layer onto the interconnect lines of an interconnect system.
Figure 4B:
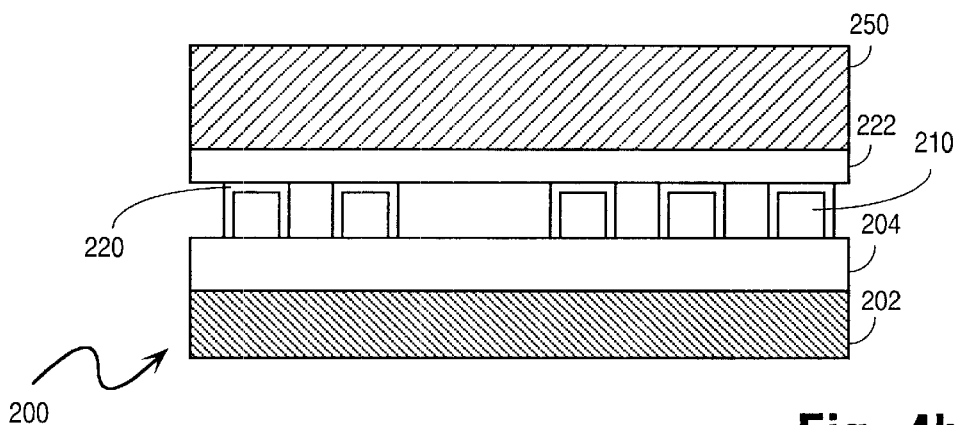
Figure 4C:
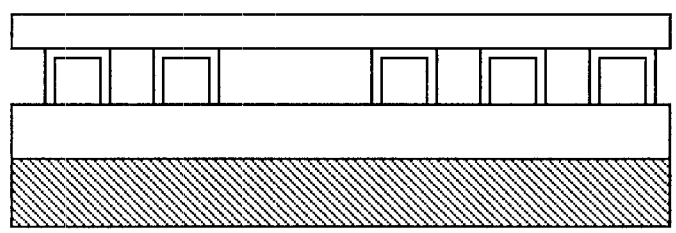
Figure 5A:
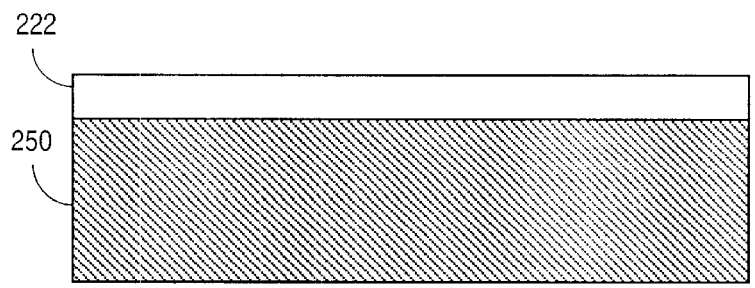
FIGS. 5a, 5b, 5c and 5d illustrate an alternative method according to the present invention for bonding a capping layer onto the interconnect lines of an interconnect system.
Figure 5B:
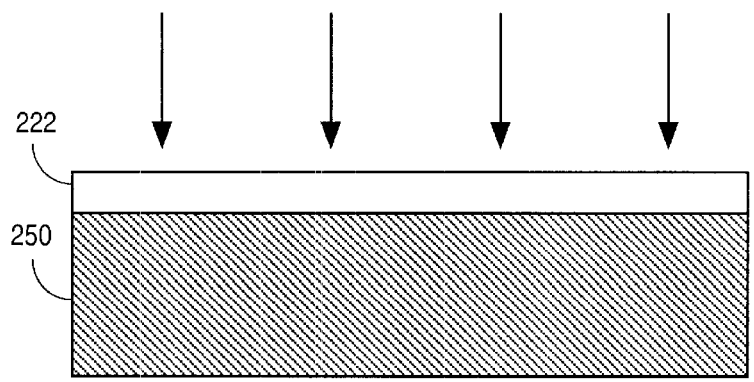
Figure 5C:
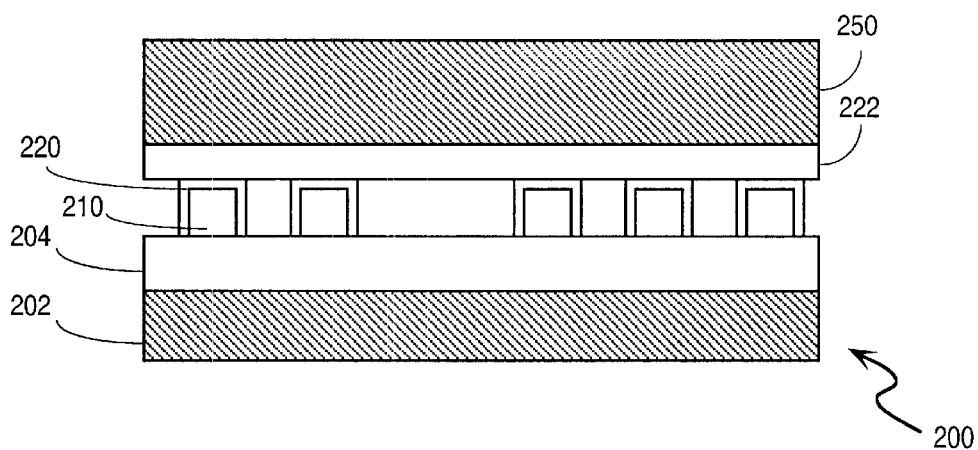
Figure 5D:
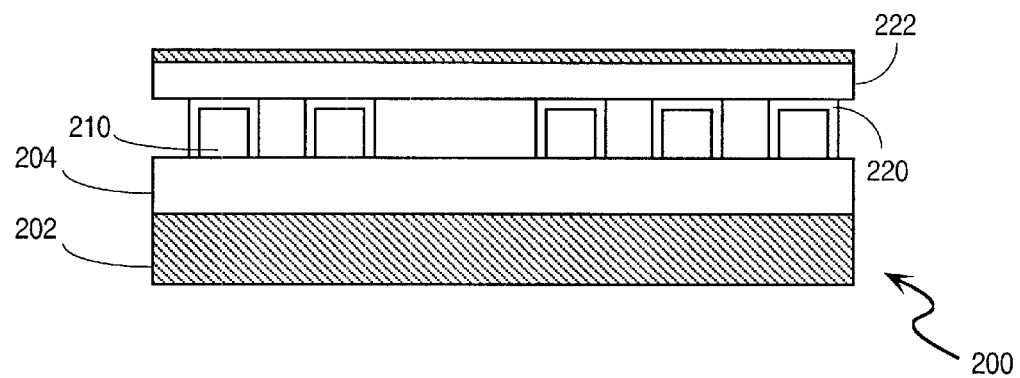

FIGS. 4a, 4b, and 4c illustrate a method for applying and bonding a capping layer 222 onto the interconnect lines of an interconnect system (not shown). At step 1 (FIG. 4a), the capping layer 222 is coated onto a film carrier 250. The film carrier 250 is made of a material which allows for relatively simple debonding of the capping layer 222 later in the process. The film carrier can be an unpatterned silicon wafer by way of non-limiting example. At step 2 (FIG. 4b), capping layer 222, bonded onto a film carrier 250, is placed upon a top surface of a cladding 220 of the interconnect lines 210 of an interconnect system 200. The interconnect system 200 includes the substrate 202 and a layer of $SiO_2$ 204 deposited thereon. The interconnect system 200, illustrated in FIGS. 4b and 4c, is substantially similar to the interconnect system described in conjunction with FIG. 3.

During-step 2, the assembly including the film carrier 250, the capping layer 222, and the interconnect system 200 is heated to a temperature high enough to allow capping layer 222 to debond from film carrier 250. This temperature also allows capping layer 222 to bond onto the cladding 220. This temperature can be, but is not limited to, approximately 400° C. The cladding 220 is made of a material that bonds to the capping layer 222 when the assembly is subjected to heat. The capping layer 222 thus bonds to the claddings 220 of the interconnect lines 210 upon heating the assembly to a temperature of approximately 400°. Concomitantly with the bonding of the capping layer 222 onto the cladding 220, the temperature of approximately 400° C. causes a weakening of the bonding between the capping layer 222 and the film carrier 250. Note that the film carrier 250, onto which the capping layer 222 is bonded at step 1, is particularly selected to have a surface with relatively weak bonding properties. Accordingly, at step 2, while the capping layer 222 bonds to the cladding 220, a simultaneous process occurs-the film carrier 250 gradually debonds from the capping layer 222 due to the weak bonding between the capping layer 222 and the film carrier 250, and to the effect of the temperature upon such weak bonding. The temperature of approximately 400° C. to which the assembly of the interconnect system and the film carrier with the capping layer are subjected acts thus as an agent for bonding the capping layer 222 onto the cladding 220 and also for debonding the capping layer 222 from the film carrier 250.

At step 3 (FIG. 4c), the film carrier 250 is delaminated from the assembly of the interconnect system and the capping layer bonded thereto. Another interconnect isolation layer (the optional second dielectric layer 224 explained in conjunction with FIG. 3) can be deposited on top of the capping layer 222 to yield the desired level of thickness of the dielectric, if the capping layer's thickness itself is not sufficient.

FIGS. 5a, 5b, 5c, and 5d illustrate an alternative method for depositing step 1 (FIG. 5a), capping layer 222 is coated onto a film carrier made of silicon 250. At step 2 (FIG. 5b), the silicon substrate 250 is implanted with ionized Hydrogen $H(2\times10^{16}-10^{17}$ particles/cm$^3$). The implanted ionized Hydrogen creates a stress-dislocated layer which causes delamination of the capping layer at a temperature of approximately 400° C. At step 3 (FIG. 5c), the assembly of the silicon substrate 250 and the capping layer 222 bonded thereto is then placed face down with the capping layer 222 disposed over the cladding 220 of interconnect lines 210 of the interconnect system 200. The assembly of the interconnect system, the silicon substrate, and the film are heated to approximately 400°, thereby causing a delamination of the silicon substrate 204, and forming a thermal bond between capping layer 222 and cladding 220 above each interconnect line. At step 4. (FIG. 5d), a final etch is performed to remove the remaining silicon layer off the capping layer 222. Alternatively, a Hydrogen implant can be performed into the capping layer 222. Upon heating the assembly, the capping layer "splits" into two layers, leaving a first part of a capping layer bonded to the interconnect lines and a second part of capping layer 222 still remaining on silicon substrate 250.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. An interconnect system for an integrated circuit comprising:

a substrate;

a first dielectric layer formed upon said substrate;

a plurality of electrically conductive interconnect lines formed upon said first dielectric layer, each of said interconnect lines having top and side surfaces, a space being defined between adjacent side surfaces of adjacent pairs of said interconnect lines, said space being filled with air;

an electrically conductive cladding disposed over said top surface of said interconnect lines; and a dielectric film having first and second sides, a stress-dislocated layer of silicon covering said first side, said second side of the dielectric film being bonded to said cladding, said space being substantially unencumbered by said dielectric film.

2. The interconnect system of claim 1 wherein said cladding extends of said side surfaces of said interconnect lines.

3. The interconnect system of claim 2 wherein said cladding comprises titanium.

4. The interconnect system of claim 3 wherein said cladding has a thickness in the range of 100–1000 angstroms.

5. The interconnect system of claim 2, wherein cladding comprises a material that minimizes electromigration in said interconnect lines.

6. The interconnect system of claim 1 wherein dielectric film comprises $SiO_2$.

7. The interconnect system of claim 1 wherein said dielectric film has a thickness in the range of a few thousand Angstroms.

8. The interconnect system of claim 6, further including at least one dummy line to support said dielectric film.

* * * * *